United States Patent [19]
Weber

[11] Patent Number: 5,351,317
[45] Date of Patent: Sep. 27, 1994

[54] INTERFEROMETRIC TUNABLE OPTICAL FILTER

[75] Inventor: Jean-Pierre Weber, Stockholm, Sweden

[73] Assignee: Telefonaktiebolaget L M Ericsson, Stockholm, Sweden

[21] Appl. No.: 929,450

[22] Filed: Aug. 14, 1992

[51] Int. Cl.$^5$ .......................... G02B 6/10; G02F 1/035
[52] U.S. Cl. ............................................ 385/3; 385/27
[58] Field of Search ...................... 385/27, 1, 2, 4, 8, 385/3, 40

[56] References Cited

U.S. PATENT DOCUMENTS

5,009,477  4/1991  Alferness et al. ...................... 385/17
5,157,744  10/1992  Korothy ................................. 385/2

OTHER PUBLICATIONS

M. Kuznetsov et al., "Widely Tunable (45 nm, 5.6 THz) Multi-Quantum-Well Three-Branch Y3-Lasers for WDM Networks" IEEE Photonics Technology Letters, vol. 5, No. 8, pp. 879-882 (Aug. 1993).
S. Miller, "Multibranch Frequency-Selective Reflectors and Application to Tunable Single-Mode Semiconductor Lasers," Journal of Lightwave Technology, vol. 7, No. 4, pp. 666-673 (Apr. 1989).
P. Granestrand et al., "Integrated Optics 4x4 Switch Matrix With Digital Optical Switches" Electronics Letters, vol. 26, pp. 4-5 (Jan. 4, 1990).
H. Heidrich et al., "Passive Mode Converter with a Periodically Tilted InP/GaInAsP Rib Waveguide", IEEE Photonics Technology Letters, vol. 4, pp. 34-36 (Jan. 1992).
Y. Inoue et al., "Polarization Sensitivity of a Silica Waveguide Termooptic Phase Shifter for Planar Lightwave Circuits", IEEE Photonics Technology Letters, vol. 4, pp. 36-38 (Jan. 1992).
T. Koch et al., "Semiconductor Lasers for Coherent Optical Fiber Communications", Journal of Lightwave Technology, vol. 8, pp. 274-293 (Mar. 1990).
T. Numai, "Semiconductor Wavelength Tunable Optical Filters", International Journal of Optoelectronics, vol. 6, pp. 239-252 (1991).
K. Oda et al., "A 16-Channel Frequency Selection Switch for Optical FDM Distribution Systems", IEEE Journal on Selected Areas in Communications, vol. 8, pp. 1132-1140 (Aug. 1990).
O. Sahlen et al., "Two-Channel Optical Filtering of 1 Gbit/s Signal With DBR Filter", Electronics Letters, vol. 27, pp. 578-579 (Mar. 28, 1991).
M. Schilling et al., "Integrated Interferometric Injection Laser: Novel Fast and Broad-Band Tunable Monolithic Light Source", IEEE Journal of Quantum Electronics, vol. 27, pp. 1616-1624 (Jun. 1991).
H. Takahashi et al., "Polarization-Insensitive Arrayed-Waveguide Grating Wavelength Multiplexer on Silicon", Optics Letters, vol. 17, pp. 499-501 (Apr. 1, 1992).
N. Takato et al., "Silica-Based Integrated Optic Mach-Zehnder Multi-Demultilplexer Family with Channel Spacing of 0.01-250 nm", IEEE Journal on Selected Areas in Communications, vol. 8, pp. 1120-1127 (Aug. 1990).

(List continued on next page.)

Primary Examiner—Frank Gonzalez
Attorney, Agent, or Firm—Burns, Doane, Swecker & Mathis

[57] ABSTRACT

An interferometric tunable optical filter selects a predetermined wavelength or wavelengths from a wavelength division multiplexed signal. The optical filter splits an input signal into a plurality of waveguide branches. In each branch, the amplitude and phase of the signal can be individually controlled. The signals are then recombined. The resulting interference gives a wavelength dependent transmission spectrum that can be adjusted as desired.

15 Claims, 3 Drawing Sheets

OTHER PUBLICATIONS

H. Yanagawa et al., "Polarization-and Wavelength-Insensitive Guided-Wave Optical Switch with Semiconductor Y Junction", *Journal of Lightwave Technology*, vol. 8, pp. 192–197 (Aug. 1990).

M. J. Ahmed et al., "Integrated Optic Series and Multibranch Interferometers" *Journal of Lightwave Technology*, vol. LT-3, No. 1, pp. 77–82 (Feb. 1985).

M. J. Ahmed et al., "Proposed Interferometric Filters", *Applied Optics*, vol. 19, No. 18, pp. 3051–3052 (Sep. 1980).

H. Takahashi et al., "Polarization-Insensitive Arrayed-Waveguide Grating Wavelength Multiplexer on Silicon", *Applied Optics*, vol. 17, No. 7, pp. 499–501 (Apr. 1992).

J. Faist et al., "Phase Modulation in GaAs/AlGaAs Double Heterostructures. I. Theory" *Journal of Applied Physics*, vol. 67, No. 11, pp. 6998–7005 (Jun. 1990).

M. Schilling et al., "Asymmetrical Y Laser With Simple Single current Tuning Response", *Electronics Letters*, vol. 28, No. 18, pp. 1698–1699 (Aug. 1992).

Patent Abstracts of Japan, vol. 17, No. 338 (P-1564), JP-A-05 045 680 (Feb. 26, 1993).

Patent Abstracts of Japan, vol. 15, No. 24 (P-1156), JP-A-02 269 323 (Nov. 2, 1990).

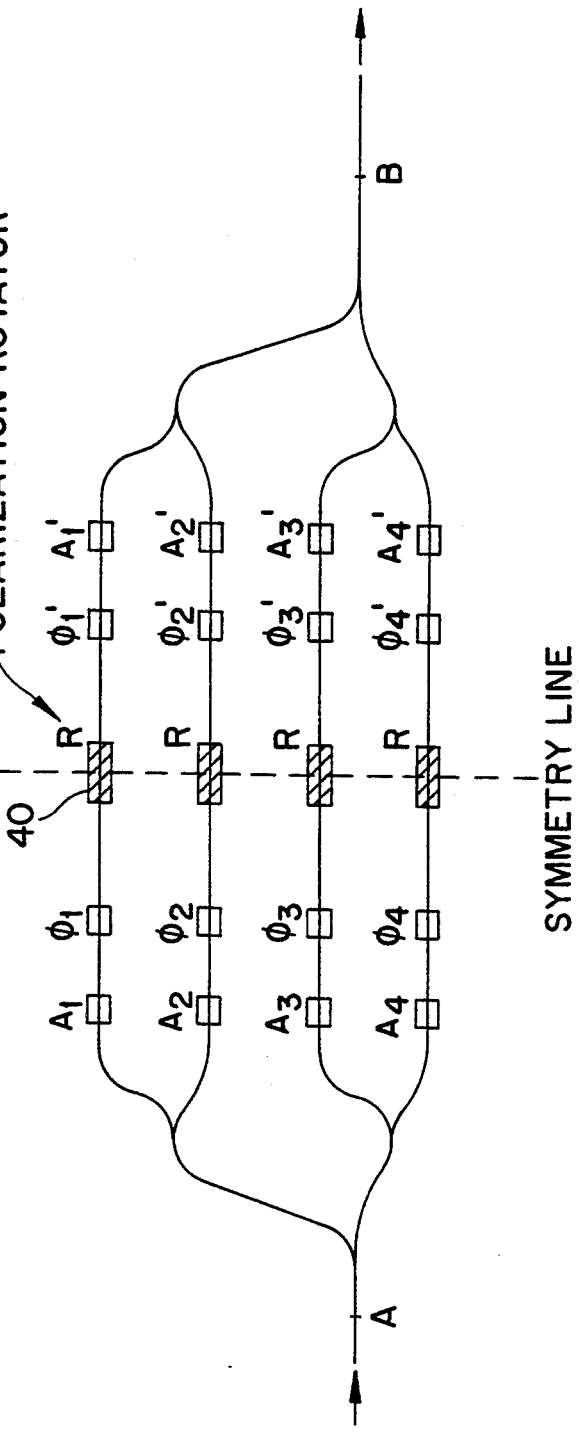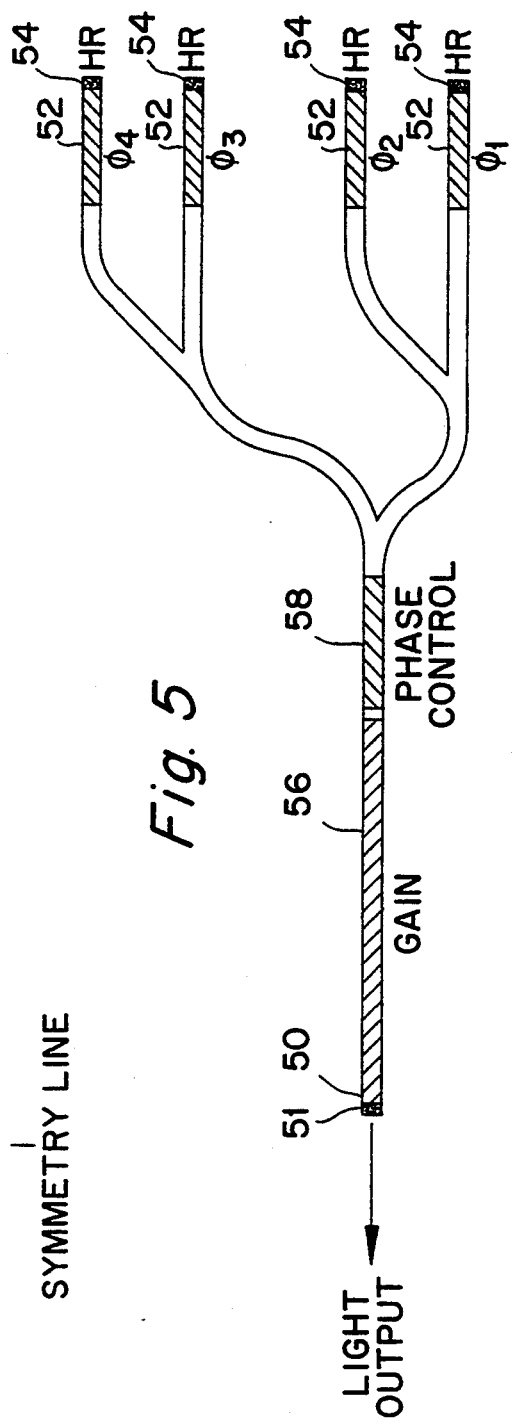

INTERFEROMETRIC TUNABLE OPTICAL FILTER

FIELD OF THE INVENTION

The present invention relates to an optical filter device and more particularly to an interferometric tunable optical filter in which a predetermined wavelength or wavelengths of an optical signal is selected from wavelength division multiplexed optical signals.

BACKGROUND OF THE INVENTION

Densely packed incoherent wavelength division multiplexed (WDM) lightwave communication systems are attractive over coherent (heterodyne) communication systems because the incoherent systems use the large wavelength (frequency) domain available in an optical fiber by assigning different wavelengths to different channels in a communication system. A key component in an incoherent WDM lightwave communication system is the lightwave receiver which provides filtering, amplification and detection of the lightwave signals. If direct detection is used instead of coherent detection, tunable optical filters will be needed to separate the different multiplexed wavelengths (channels) both for routing and final detection purposes. A WDM receiver using direct optical detection must optically filter the multifrequency WDM signal to pass only the desired channel to the direct optical detector. A tunable optical filter therefore has the function of selecting a predetermined wavelength light signal from the plurality of multiplexed lightwave signals. Thus, the goal of a tunable optical filter is to select one channel (or several channels) in a given incoming wavelength multiplexed optical signal and block the other channels from passing through the filter.

Several different optical filters have been developed. Fabry-Perot filters with mechanical tuning, i.e., a piezoelectric element, have been developed. However, the use of mechanically operated filters has several disadvantages. First, optical filters with moving components are typically bulky and are expensive to produce. In addition, optical filters with moving components have poor reliability and lower switching speeds than electronically controlled optical filters. Optical filters based on acousto-optic TE/TM mode conversion and waveguides have also been developed. However, these filters require a relatively complex drive circuit to generate the required acoustic waves. In addition, the filters are relatively large with a length on the order of one to two centimeters. Optical filters based on semiconductor distributed feedback (DFB) laser diodes and multi-section Fabry-Perot laser diodes have also been developed. Such distributed feedback semiconductor laser structures are operated with a bias current set below the threshold current for lasing. While these devices have the advantage of having gain, they also have several drawbacks. First, the tuning range of these distributed feedback semiconductor laser devices is small at less than 2 nanometers at a wavelength of 1.5 micrometers in a InGaAsP/InP device. Furthermore, they have a very narrow width because of the gain and they are susceptible to saturation effects if the incoming signal power is too high.

Optical filters based upon a distributed-Bragg reflection (DBR) laser structure have also been developed. The distributed-Bragg reflection laser structure is employed as an integrated receiver within a lightwave communication system. The DBR laser structure is biased electrically below the lasing threshold to operate as a multifunctional element by performing the integrated operations of resonant amplification and filtering of the received lightwave signals. By electrically biasing the Bragg section of the DBR laser structure, it is possible to tune the filtering so as to select the desired wavelength. The DBR laser structure has a larger tuning range, up to 15 nanometers, than the DFB laser diodes and it can be made insensitive to the power of the input signal by removing the gain section. However, the DBR laser structure operates using reflection wherein the output signal is reflected back through the input signal which results in loss penalties when the signals are separated.

SUMMARY OF THE DISCLOSURE

The present invention discloses a tunable optical filter for use in wavelength division multiplexing systems. The optical filter splits an input signal into a plurality of branches. In each branch, the amplitude and phase of the signal can be individually controlled. The signals are then recombined. The signals can be recombined by using the same type of Y-junction that was used for splitting the light between the branches. The resulting interference gives a wavelength dependent transmission spectrum that can be adjusted as desired.

In another embodiment of the present invention, an interferometric tunable optical filter is used in a laser as a wavelength control means. A waveguide is formed in and laterally defined within the surface of a semiconductor substrate. A partially transmitting end mirror allows light to exit the laser. A section of the waveguide is split into a plurality of branches. Each branch may contain a phase control means and a high reflectivity means for reflecting light back through the phase control means. A phase control section is located on the waveguide to select a desired wavelength of light. The waveguide also contains a gain control section.

BRIEF DESCRIPTION OF THE DRAWINGS

This and other features and advantages of the present invention will be readily apparent to one of ordinary skill in the art from the following written description read in conjunction with the drawings in which:

FIG. 4 illustrates a polarization independent optical filter of the present invention; and FIG. 5 illustrates a tunable wavelength laser using an interferometric filter of the present invention as a wavelength selective element.

DESCRIPTION OF THE PREFERRED EMBODIMENTS

Figure 1:
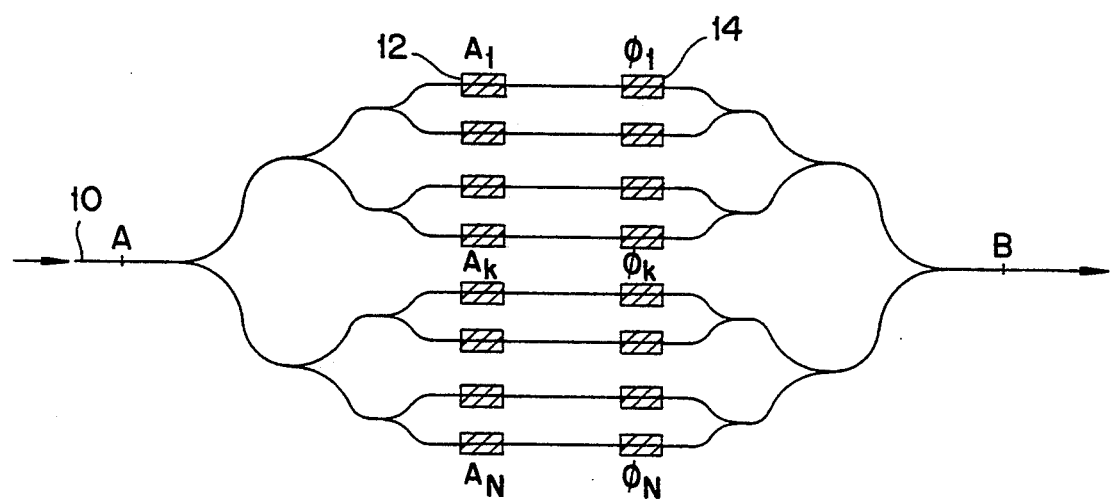
FIG. 1 illustrates an optical filter of the present invention.

FIG. 1 illustrates an optical filter 10 of the present invention. The light in the input waveguide 10 is split into a plurality of branches N. The light can be split into the different branches by a Y-junction splitter or a digital switch. An amplitude control element 12 and a phase control element 14 are located in each branch. In addition, the path length from point A to point B is different for each branch. As a result, the light from the different branches will not be in phase with each other so that the light in the different branches will interfere with each other when the light from each branch is recombined. Interference between different light signals depends upon the phase differences between the signals. Since the phase difference is a function of the wavelength, the structure of the present invention results in a wavelength dependent transmission from A to B. The power spectrum from A to B, as a function of the wavelength $\lambda$, for a device with N branches can be calculated as follows:

$$T(A \rightarrow B) = \left| \sum_{k=1}^{N} A_k \exp\left(-j\frac{2\pi}{\lambda} nL_k + j\phi_k\right) \right|^2 \quad \text{(eq. 1)}$$

where the amplitude $A_k$ of each branch is controlled by the amplitude control element 12, the phase $\phi_k$ is controlled by the phase control element 14, n is the effective refractive index for the light propagating in the waveguide and $L_k$ is the distance from A to B for the light going through branch k. By changing the amplitude and phase, the transmission spectrum through the filter can be changed. As a result, the resulting structure can be used as a tunable optical filter. It is also possible to cascade several of these devices so that the resulting transmission spectrum will be the product of the transmission spectrum of each device.

Figure 2:
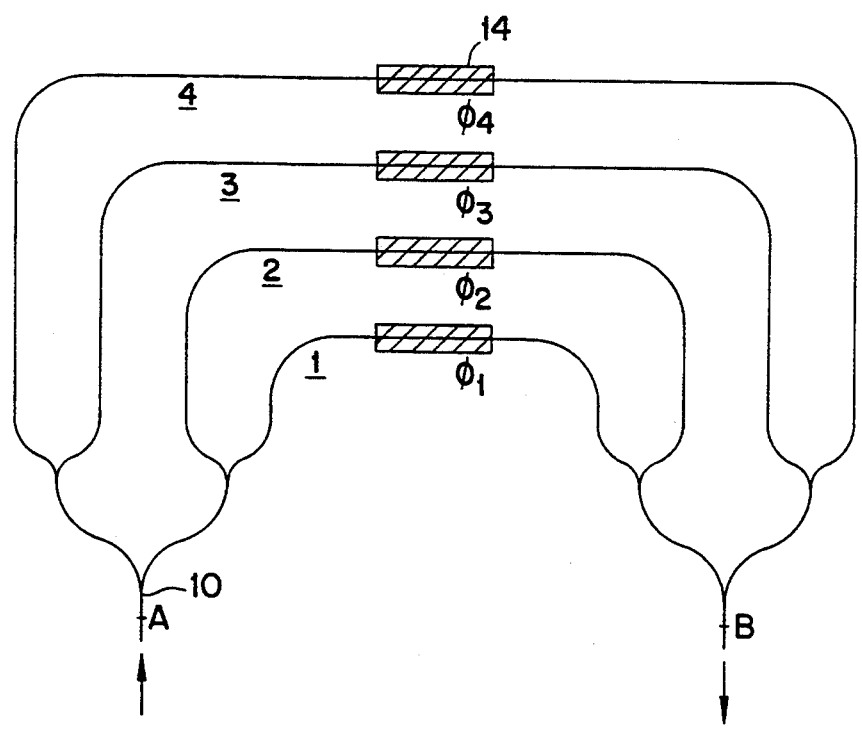
FIG. 2 illustrates another embodiment of an optical filter of the present invention.

FIG. 2 illustrates a specific embodiment of the present invention in which the number of branches N is equal to 4. In this simple example, the filter does not have an amplitude control element 14 and the light is split equally between the four branches. Each branch does however contain a phase control section. The length of each branch and the phase for each branch are based upon the following relationships:

$$L_k = L_0 + k^*d \quad \text{(eq. 2)}$$

$$\phi_K = (\phi_0 = K^*\Psi) \bmod 2\pi \quad \text{(eq. 3)}$$

As a result, the power transmission spectrum for the device can be written as:

$$T_N = \left( \frac{\sin((2\pi nd/\lambda - \psi)N/2)}{\sin(\pi nd/\lambda - \psi/2)} \right)^2 \quad \text{(eq. 4)}$$

As a result, the power transmission spectrum $T_N$ depends only on n, d and N (which are fixed) and on $\Psi$, which is tunable. With this choice of parameters, a periodic filter results with a period fixed by nd. In addition, the periodic filter has a bandpass position that is tunable within the fixed period by $\Psi$. As a result, each phase section needs to be able to provide a phase shift in the range of 0 to $2\pi$ since everything is modulo $2\pi$.

Figure 3:
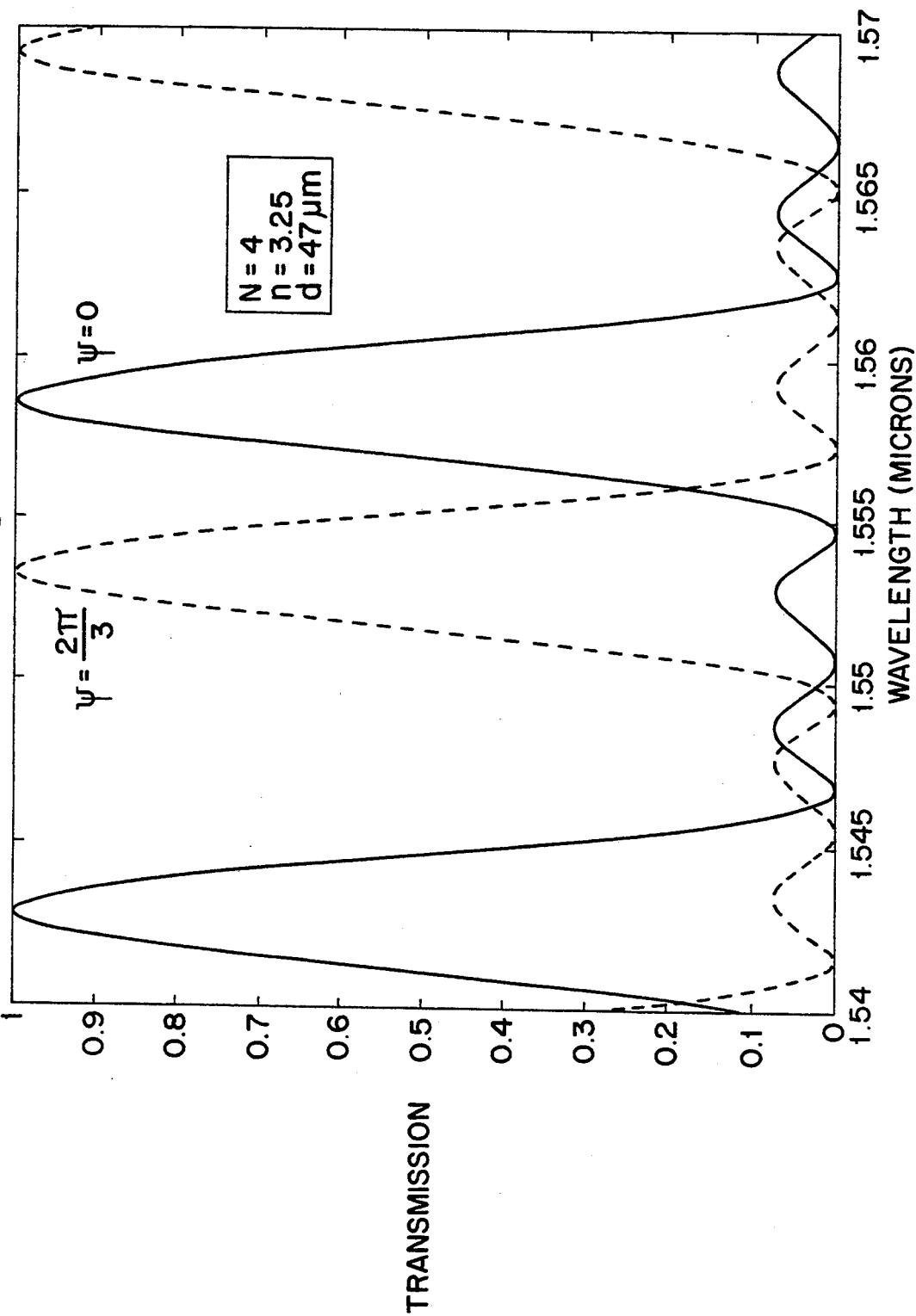
FIG. 3 is an explanatory diagram showing the power transmission spectrum of an optical filter of the present invention.

FIG. 3 illustrates the power transmission spectrum of the optical filter illustrated in FIG. 2. For FIG. 3, the parameters are set to N=4, n=3.25, d=47 micrometers, and $\lambda$ is approximately 1.55 micrometers. The solid line represents the power spectrum when $\Psi=0$ and the dashed line indicates the power spectrum when $\Psi=2\pi/3$. In this embodiment, the period of the filter is approximately 15.7 nanometers.

The way in which the amplitude and phase control elements can be implemented depends upon the material used to make the filter. In a direct gap semiconductor such as InGaAsP/InP, for the range of 1.2 to 1.6 micrometers, and AlGaAs/GaAs, for the range of 0.8 to 0.9 micrometers, the amplitude control section can be realized by a variable loss/gain element such as by making a section of the waveguide a semiconductor diode amplifier. The waveguide core is constructed out of a material with a bandgap wavelength corresponding to the wavelength of the light through the device and it is sandwiched between higher bandgap p and n doped material, so that carriers can be injected and provide gain when the amplifier is forward biased. If no current is applied to the amplifier, the waveguide will absorb light. However if sufficient current is applied to the amplifier, the waveguide will have gain.

In another embodiment of the present invention, the amplitude of the light can be controlled in the different branches by using a digital switch at each splitting as disclosed in "Integrated Optics 4x4 Switch Matrices With Digital Optical Switches", P. Granestrand, Electronic Letters, Vol. 26 (1), Jan. 4, 1990, pp. 4 and 5, and "Polarization-And Wavelength Insensitive Guided-Wave Optical Switch with Semiconductor Y-Junction", H. Yanagawa, K. Ueki, and Y. Kamata, Journal of Lightwave Technology, Vol. 8(8), Aug. 1990, pp. 1192–1197, which are incorporated herein by reference. As a result, the splitting ratio of the light can be controlled by the voltage or current applied to the switch. The digital switch can be used with semiconductors, but also, for example, with LiNbO$_3$ devices.

The phase control section can be realized by a waveguide section with a tunable effective index. The effective index tuning can be achieved in several ways. First, free carrier injection in the waveguide can be used. Free carrier injection method uses forward bias in a p-i-n diode structure to inject carriers into the waveguide. This method is used in tunable DBR lasers as disclosed in "Semiconductor Lasers for Coherent Optical Fiber Communications", T. Koch and U. Koren, Journal of Lightwave Technology, Vol. 8(3), Mar. 1990, pp. 274–293. Free carrier depletion in the waveguide can also be used to change the effective index of refraction. The free carrier depletion method uses a reverse bias to sweep the carriers out of the waveguide thereby changing the effective index of refraction. The effective index of refraction can also be changed using electro-optic tuning. In electro-optic tuning, the electric field applied through a reverse biased p-i-n structure changes the refractive index with the waveguide. This can be done with bulk material, but quantum wells should probably be used in order to get a sufficient index change. The above-listed methods changing the effective index are not meant to be exclusive since other methods are also possible. For example, if the waveguides were made out of SiO$_2$ on Si, thermo-optic tuning could be used to change the effective index of refraction of the waveguide.

The filter is generally polarization dependent, which means that polarization diversity would have to be used if there were no control of the state of polarization of the incoming light. However, if an element that rotates the polarization of light by 90° is introduced into the middle of each branch of the waveguide so that the device is symmetrical with respect to the polarization element, then the whole device will be polarization independent. FIG. 4 illustrates a four-branch optical filter which contains polarization rotators 40. The polarization rotators 40 are situated in the middle of each branch so that the device is symmetrical with respect to the polarization rotator. In addition, the phase and amplitude control elements must be split symmetrically with respect to the polarization rotator as illustrated in FIG. 4. As a result, an amplitude control element and a phase control element must be provided on both sides of the polarization rotator 40.

The polarization rotator 40 can be implemented in several ways. First of all, the polarization rotator can be implemented as a waveguide mode converter as disclosed in "Passive Mode Converter with a Periodically Tilted InP/GaInAsP Rib Waveguide", H. Heindrich et al., IEEE Photon. Technololy Letters, Vol. 4(1), Jan. 1992, pp. 34–36. In addition, the rotator can be implemented as a quartz plate as described in "Polarization Insensitive Arrayed-Waveguide Grating Wavelength Multiplexer on Silicon", H. Takhashi, Y. Hibino, and I. Nishi, Optics Letters, Vol. 17(7), Apr. 1, 1992, pp. 499–501.

In another embodiment of the present invention, the optical filter can be used as a replacement for a tunable grating in a three-section DBR laser. In this embodiment, the design of the filter is simplified by folding the filter along the symmetry line through each branch. FIG. 5 illustrates such a laser with a four-branch interferometric section. A phase control element 52 is located in each of the four branches of the waveguide 50. A high reflectivity element 54 is located at the end of each phase control element 52. Light traveling in the waveguide passes through a gain section 56 and a phase control section 58. The light is then split into the four different branches of the waveguide by Y-junction splitters or digital switches. The light passes through the phase control elements 52 and is reflected back through the phase control elements 52 by the high reflectivity element 54. A partially transmitting mirror element 51 located at the end of the gain section 56 allows a fraction of the light to exit the laser and reflects the rest of the light back into the gain section 56. The light in each of the branches of the waveguide have different phases. The phase control elements 52 need only be able to produce phase shifts between 0 and $\pi$ since the light traverses the phase control elements twice.

The reflection spectrum of the interferometric section is the same as the transmission spectrum of the optical filter described above and is also tunable. The tuning range depends on the period of the filter and could be chosen by choosing the differences between the lengths of the different branches. The phase control elements 52 would permit the wavelength selection within the period of the filter. The phase control section 58 is used to adjust the global round trip phase in the laser and can thus be used as a fine control for the lasing wavelength.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims, rather than the foregoing description and all changes which come within the meaning and range of equivalents thereof are intended to be embraced therein.

What is claimed is:

1. An interferometric tunable optical filter comprising:
   a semiconductor substrate having a first electrode provided on a first surface thereof;
   a waveguide formed in and laterally defined within the surface of said substrate for carrying lightwaves, wherein a section of said waveguide is split into more than two parallel branches, each branch having a different length, wherein each branch of said waveguide contains a phase control means for changing the effective index of waveguide;
   means for splitting said lightwaves into said branches of said waveguide; and
   means for recombining said lightwaves after said split section of said waveguide.

2. An interferometric tunable optical filter according to claim 1, wherein each branch of said waveguide contains an amplitude control means.

3. An interferometric tunable optical filter according to claim 2, wherein said amplitude control means is a semiconductor amplifier.

4. An interferometric tunable optical filter according to claim 1, wherein each branch of said waveguide contains a polarization rotator.

5. An interferometric tunable optical filter according to claim 1, wherein each branch of said waveguide contains an amplitude control means and a polarization rotator.

6. An interferometric tunable optical filter according to claim 4, wherein said polarization rotator is a waveguide mode converter.

7. An interferometric optical filter according to claim 4, wherein said polarization rotator is a quartz plate.

8. An interferometric tunable optical filter according to claim 1, wherein said phase control means changes the effective index of the waveguide by free carrier injection in the waveguide.

9. An interferometric tunable optical filter according to claim 1, wherein said phase control means changes the effective index of the waveguide by free carrier depletion in the waveguide.

10. An interferometric tunable optical filter according to claim 1, wherein said phase control means changes the effective index of the waveguide by electro-optic tuning.

11. An interferometric tunable optical filter according to claim 1, wherein said phase control means changes the effective index of the waveguide by thermo-optic tuning.

12. An interferometric tunable optical filter according to claim 1, wherein said means for splitting said lightwaves is a digital switch which also acts as amplitude control means.

13. An interferometric tunable optical filter according to claim 1, wherein said means for splitting said lightwaves is a Y-junction splitter.

14. An interferometric tunable optical filter according to claim 1, wherein said means for recombining said lightwaves is a digital switch.

15. An interferometric tunable optical filter according to claim 1, wherein said means for recombining said lightwaves is a Y-junction splitter.

* * * * *